United States Patent [19]

Kriz

[11] Patent Number: 5,142,431
[45] Date of Patent: Aug. 25, 1992

[54] OUTPUT STAGE FOR AN AC VOLTAGE SWITCH

[75] Inventor: Dieter Kriz, Lüdenscheid, Fed. Rep. of Germany

[73] Assignee: Christian Lohse Beruhrungslose Schaltechnik GmbH, Katzwinkel/Bertzdorf, Fed. Rep. of Germany

[21] Appl. No.: 463,089

[22] Filed: Jan. 10, 1990

[30] Foreign Application Priority Data

Jan. 13, 1989 [DE] Fed. Rep. of Germany ....... 3900801

[51] Int. Cl.⁵ .............................................. H02H 3/18
[52] U.S. Cl. ................................................... 361/87
[58] Field of Search ................ 361/87, 100, 5, 115

[56] References Cited

U.S. PATENT DOCUMENTS 4,378,586 3/1983 Bete ..................... 361/100
4,893,211 1/1990 Bynum et al. ............ 361/87

FOREIGN PATENT DOCUMENTS 3146709 2/1983 Fed. Rep. of Germany .
3536925 4/1987 Fed. Rep. of Germany .

Primary Examiner—Steven L. Stephan
Assistant Examiner—Ed To
Attorney, Agent, or Firm—Sprung Horn Kramer & Woods

[57] ABSTRACT

The invention relates to an output stage for an ac voltage switch, more particularly an ac voltage proximity switch, wherein a load is supplied from an ac voltage source via a rectifier which can be connected from an input stage via a control stage to a MOSFET connected to the output of the rectifier, wherein the internal voltage supply of the input stage and the control stage, when the rectifier is not connected the input stage and the control stage are connected via a source or an emitter-follower with voltage-stabilized input to the ac voltage source, and when the rectifier is connected the input stage and the control stage are connected to a voltage-stabilized electronic structural component at the output of the rectifier. This voltage-stabilized structural component is the MOSFET connected to the output of the rectifier, and when the rectifier is connected, the FET or transistor of the source or emitter-follower is connected through by the control stage.

3 Claims, 1 Drawing Sheet

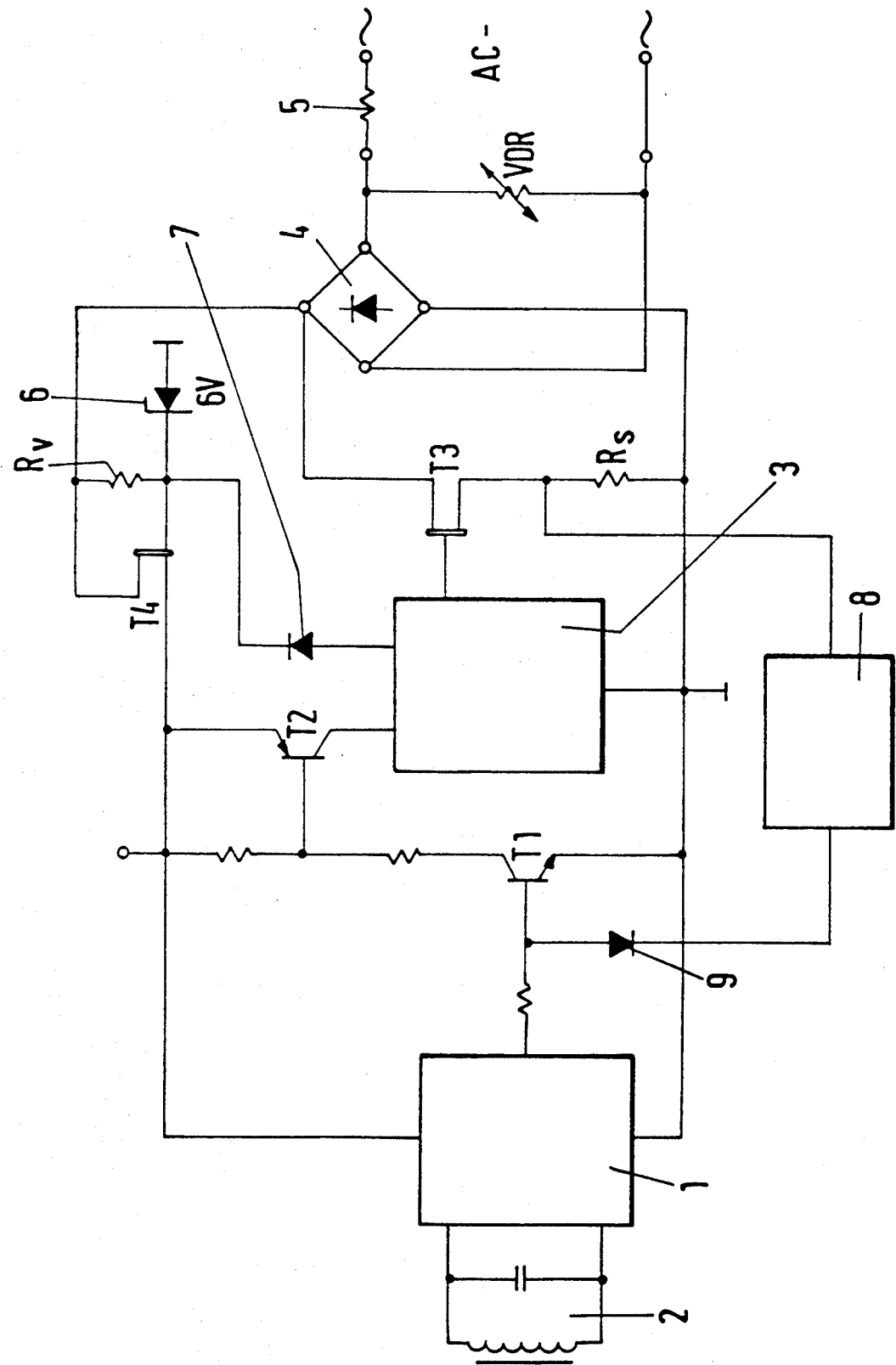

OUTPUT STAGE FOR AN AC VOLTAGE SWITCH

BACKGROUND OF THE INVENTION

The invention relates to an output stage for an a.c. voltage switch, more particularly an a.c. voltage proximity switch, wherein a load is supplied from an a.c. voltage source via a rectifier which can be connected from an input stage via a control stage to a MOS-FET connected to the output of the rectifier, wherein the internal voltage supply of the input stage and the control stage, when the rectifier is not connected the input stage and the control stage are connected via a source or emitter follower with voltage-stabilized input to the a.c. voltage source, and when the rectifier is connected the input stage and the control stage are connected to a voltage-stabilizing electronic structural component at the output of the rectifier.

Output stages for a.c. voltage switches of the kind specified are normally operated with the mains a.c. voltage, the two output cables connected to the rectifier being connected to the mains via the useful load, for example, a relay, an indicator lamp or the like.

In one a.c. voltage switch used in practice, the rectifier can be connected by means of a thyristor triggered by the control stage. The thyristor is in series with a Zener diode at which the internal supply voltage is tapped when the rectifier is connected. The Zener diode connected to the anode of the thyristor stabilizes the supply voltage. When the rectifier is not connected, the internal voltage supply comes from the mains via a source follower connected to the output of the rectifier. An a.c. voltage switch of that kind has a number of disadvantages.

However, German Patent Specifications 31 46 709 C1 and 35 36 925 A1 also disclose a.c. voltage switches of the kind specified in which a MOS-FET is used instead of the thyristor.

For the currents of up to about 1 A involved in a.c. voltage switches, Zener diodes are obtainable only up to a minimum Z voltage of about 5 V. With an output current of the connected a.c. voltage switch of only 0.5 A flowing through the Zener diode, a power loss of about 2.5 W takes place. As a result, the a.c. voltage switch becomes progressively hotter, so that its switch points change. Moreover, Zener diodes are temperature-dependent with regard to their Z voltage, so that the connection and disconnection points of the a.c. voltage switch are displaced due to the internal supply voltage tapped at the Zener diode. Switch point stability further deteriorates due to the fact that the Z voltage depends on current. With an a.c. voltage switch output current of, for example 20 mA the Z voltage is about 20% lower than with a current of 0.5 A. Other disadvantages are the large amount of space required by the Zener diode and the fact that the heat is generated concentrated at a point, so that local damage may occur inside the switch. Lastly, the voltage drop in the connected-through condition along the series connection of a thyristor and a 5 V Zener diode is about 8 V; with a low mains voltage this value is too high for many applications, if a sufficiently high supply voltage is to be available.

In addition to these disadvantages resulting directly from the use of a Zener diode, another disadvantage of the a.c. voltage switch is that once a thyristor has been fired, it can be switched off again at the earliest only at the next crossover of the operating voltage. If during that time the output current exceeds the maximum permissible value, for example, due to the short circuiting of the external load, the thyristor is destroyed and the switch is no longer capable of operation. Effective protection against short circuiting cannot be provided at a reasonable cost.

SUMMARY OF THE INVENTION

It is an object of the invention to provide an a.c. voltage switch, more particularly an a.c. voltage proximity switch which is temperature-stable as regards its switching behaviour. It can also be provided with protection against short circuiting at low cost. The switch according to the invention can also be made substantially independent of the value of the mains voltage at low cost.

This problem is solved according to the invention in an a.c. voltage switch of the kind specified wherein the voltage-stabilizing structural component is the MOS-FET connected to the output of the rectifier, and when the rectifier is connected, the FET or transistor of the source or emitter follower is connected through by the control stage.

In the a.c. voltage switch according to the invention, a MOS-FET is substituted for the series connection comprising the thyristor or MOS-FET and Zener diode in the prior art a.c. voltage switch. The FET has the property of a temperature-stable ideal Zener diode with a sharp flexion point—i.e., a very satisfactory voltage stabilization for currents of 5 mA to 500 mA. Since the constant voltage drop at the FET is only 2 V, a power loss of only 1 W takes place, even with an output current of 500 mA. The heat evolved is therefore several times lower, in comparison with the prior art circuit using a Zener diode. This low evolution of heat even with the maximum output current guarantees that the temperature-sensitive structural elements of the a.c. voltage switch are not temperature-loaded to such an extent that switch point displacements occur. The current-independent low constant voltage of about 2 V at the FET when the rectifier is connected is available via the FET of the source follower switched through by the control stage with both high and low mains voltages as the internal power supply of the input stage and the control stage. If according to a further feature of the invention the input stage has an internal voltage stabilization, switch point displacements will not occur due to different values of supply voltages of the input stage and the control stage with the rectifier connected and disconnected. The current-independent constant low drop in voltage at the FET is important even with a low mains voltage, since it ensures that the load has a sufficiently high voltage available.

A protection against short circuiting can readily be provided by the feature that disposed at the output of the rectifier is a current sensor of the control stage, which disconnects the rectifier at its maximum permissible current.

BRIEF DESCRIPTION OF THE DRAWING

A detailed description of an a.c. voltage proximity switch will now be given with reference to the FIGURE which is a circuit diagram.

DETAILED DESCRIPTION OF THE INVENTION

An a.c. voltage proximity switch comprises as the input stage an oscillator 1 having an evaluation circuit which has an internal voltage stabilization for an operating voltage of 3-10 V. As a sensor for metallic targets the oscillator 1 has a coil of an oscillatory circuit 2. The output of the oscillator 1 is coupled via an amplifying and pulse-forming stage comprising two transistors T1, T2 to the input of a control stage 3 taking the form of a voltage transformer circuit. The output of the control stage 3 is connected to the gate of a power MOS-FET T3. The drain source section of the MOS-FET T3 is in series with a resistor $R_s$ for current sensing. This series connection forms the bridge arm of a full-wave rectifier 4 connected by its input via a load 5 to an a.c. voltage source. A VDR resistor is connected to the terminals of the rectifier 4, which protects the switch against voltage peaks.

A source follower T4, including $R_v$ resistor and Zener diode 6 has a drain source section is connected in series by an arm of the rectifier 4 and the load 5 to the a.c. voltage source. On the one hand a Zener diode 6 and on the other hand a control output of the control stage 3 are connected via a diode 7 to the gate of the MOS-FET T4.

Connected to the sensor resistor $R_s$ is a current sensor 8 which via a diode 9 delivers a signal to the base of the transistor T1.

The a.c. voltage proximity switch operates as follows:

The oscillator 1 oscillates as long as there is no magnetizable target adjacent the coil of the oscillatory circuit 2. In that case the rectifier 4 is disconnected. In this phase the oscillator 1 is supplied with mains voltage via a load 5, an arm of the rectifier 4 and FET T4 of the source follower. The supply voltage at the oscillator 1 is stabilized to about 5 V by Zener diode 6 of the source follower. As soon as a magnetizable target arrives adjacent the coil of the oscillatory circuit 2, the oscillator 1 stops oscillating. Its output signal then connects the transistor T1 through, so that the transistor T2 is controlled through. The control stage 3 then triggers MOS-FET T3, so that the rectifier 4 is connected. A heavy current then flows via the load 5 and triggers a switching operation if the load takes the form of a relay, or lights up a pilot lamp, if the load takes the latter form. The MOS-FET T3 then carries the required stabilized low voltage of about 2 V.

At the same time as the MOS-FET T3 is connected through, the MOS-FET T4 is so triggered via the diode 7 that it connects through. The output voltage of the rectifier 4 stabilized by the MOS-FET T3 is then the power supply both at the oscillator 1 and also at the control stage 3. The value of the resistor $R_s$ is so low that the voltage drop at the resistor $R_s$ is negligible throughout the range of current in comparison with the voltage drop at the MOS-FET T3.

The voltage drop at the resistor $R_s$ is detected by the current sensor 8. If the current in the rectifier 4 exceeds a given maximum value, for example, due to a short circuit, a signal from the current sensor 8 blocks the transistor T1. As a result, the MOS-FET T3 is also blocked. If the signal of the oscillator 1 continues, after a certain period the MOS-FET T3 is connected through again. If the current sensor 8 then again measures an excessively high current value, the switch is again disconnected. This process is repeated as long as the short circuit continues.

I claim:

1. An alternating current voltage switch comprising: an input stage switchable between first and second states and producing a switching signal representative of the states; a control stage receptive of the switching signal for producing a control signal; and an output stage comprising a load connectable to an alternating current voltage supply, a rectifying circuit having an input connected to the voltage supply through the load and an output for supplying an input voltage to the input stage and the control stage, a voltage stabilizing electronic component comprising a MOS-FET connected across the output of the rectifying circuit and responsive to the control signal for switching on when the input stage is in the second state to stabilize the voltage of the output of the rectifying circuit and a source or emitter follower circuit connected to the output of the rectifying circuit and controlled by the control stage for supplying a stabilized input voltage to the input stage when the voltage stabilized electronic component is switched off and an input voltage stabilized by the voltage stabilized electronic component when the voltage stabilized electronic component is switched on.

2. The switch according to claim 1, wherein the control stage further comprises a current sensor connected to the output of the rectifying circuit for producing the control signal when the current sensor senses a current in the voltage stabilizing electronic component greater than a preselected value.

3. The switch according to claim 1, wherein the input stage has internal voltage stabilization.

* * * * *